US008077436B2

(12) United States Patent
Hirata et al.

(10) Patent No.: US 8,077,436 B2
(45) Date of Patent: *Dec. 13, 2011

(54) CPP-TYPE MAGNETORESISTANCE EFFECT ELEMENT HAVING THREE MAGNETIC LAYERS

(75) Inventors: Kei Hirata, Tokyo (JP); Satoshi Miura, Tokyo (JP); Tomohito Mizuno, Tokyo (JP); Takeo Kagami, Tokyo (JP)

(73) Assignee: TDK Corporation (JP)

( * ) Notice: Subject to any disclaimer, the term of this patent is extended or adjusted under 35 U.S.C. 154(b) by 917 days.

This patent is subject to a terminal disclaimer.

(21) Appl. No.: 12/052,633

(22) Filed: Mar. 20, 2008

(65) Prior Publication Data

US 2009/0237839 A1 Sep. 24, 2009

(51) Int. Cl.
*G11B 5/39* (2006.01)
(52) U.S. Cl. .................................................. 360/324.12
(58) Field of Classification Search ............... 360/324.1, 360/324.11, 324.12, 324.2
See application file for complete search history.

(56) References Cited

U.S. PATENT DOCUMENTS

| 7,035,062 | B1 | 4/2006 | Mao et al. | |
| 2002/0075611 | A1* | 6/2002 | Seigler et al. | 360/324 |
| 2003/0179520 | A1* | 9/2003 | Hasegawa | 360/324.12 |
| 2006/0232892 | A1* | 10/2006 | Covington et al. | 360/324 |
| 2009/0237839 | A1* | 9/2009 | Hirata et al. | 360/234.3 |
| 2009/0257153 | A1* | 10/2009 | Liu | 360/324.12 |
| 2010/0097729 | A1* | 4/2010 | Gill et al. | 360/324 |

FOREIGN PATENT DOCUMENTS

| JP | 11-96516 | | 4/1999 |
| JP | 2000-101164 | A | 4/2000 |
| JP | 2006-80116 | A | 3/2006 |
| JP | 2007-49118 | A | 2/2007 |

* cited by examiner

*Primary Examiner* — Jefferson Evans
(74) *Attorney, Agent, or Firm* — Knobbe Martens Olson & Bear LLP

(57) ABSTRACT

A magnetoresistance effect element comprises: a magnetoresistive stack including: first, second and third magnetic layers whose magnetization directions change in accordance with an external magnetic field, said second magnetic layer being located between said first magnetic layer and the third magnetic layer; a first non-magnetic intermediate layer sandwiched between said first and second magnetic layers; and a second non-magnetic intermediate layer sandwiched between said second and third magnetic layers; wherein sense current is adapted to flow in a direction perpendicular to a film plane; a bias magnetic layer provided on an opposite side of said magnetoresistive stack from an air bearing surface.

15 Claims, 8 Drawing Sheets

State A        State B        State C        State D

CPP-TYPE MAGNETORESISTANCE EFFECT ELEMENT HAVING THREE MAGNETIC LAYERS

BACKGROUND OF THE INVENTION

1. Field of the Invention

The present invention relates to a magnetoresistance effect element, and particularly relates to an element structure of a magnetoresistance effect element having three magnetic layers.

2. Description of the Related Art

As a reproducing element of a thin film magnetic head, GMR (Giant Magneto-Resistance) elements are widely known, and recently, in order to cope with higher recording density, CPP (Current Perpendicular to the Plane)-type GMR elements, in which sense current flows in a direction that is perpendicular to the film plane of the element, have been used. An element that is a type of CPP-type element and that has attracted attention in recent years as a magnetoresistance effect element with high sensitivity is a TMR (Tunnel Magneto-Resistance) element utilizing the TMR effect.

The TMR element includes a stack forming a magnetoresistance effect film (a MR stack) having a magnetic layer (free layer) whose magnetization direction changes in accordance with an external magnetic field, a magnetic layer (pinned layer) whose magnetization direction is fixed with respect to an external magnetic field, and a non-magnetic and non-conductive tunnel barrier layer sandwiched between the pinned layer and the free layer. Further, the MR stack is magnetically shielded by shield layers, which also work as electrodes for supplying a sense current to the MR stack, on both sides thereof with regard to the direction of stacking. The free layer is magnetized into a single domain state by a bias magnetic field from bias magnetic field layers provided for example on both sides of the MR stack with regard to the track width direction. When a sense current is applied to the element in the direction of stacking, electrons pass through the energy barrier of the non-magnetic and non-conductive tunnel barrier layer due to the tunnel effect, and flow from the free layer to the pinned layer (or the other way around). It is known that resistance to the sense current changes in accordance with the relative angle between the magnetization directions of the two magnetic layers which sandwich the tunnel barrier layer. By varying of the magnetization direction of the free layer in accordance with the external magnetic field, the above-mentioned relative angle can change, and accordingly a change in resistance to the sense current can be detected.

By making use of such property of the sense current, the TMR element detects the strength of an external magnetic field, and reads the magnetic data of a recording medium. The reproduction output of the magnetoresistance effect element depends on the magnetoresistance ratio. The TMR element has an extremely large magnetoresistance ratio compared to the conventional GMR element, and thus has an advantage of easily realizing a magnetoresistance effect element with high output.

Meanwhile, from the viewpoint of further improvement of the track recording density, a reduction in the spacing between upper and lower shield layers (a gap between shields) is required, and in order to achieve this, a decrease in thickness of the MR stack is required. However, a significant limitation at this time is the presence of the pinned layer. Since the pinned layer requires that the magnetization direction be firmly fixed without being influenced by an external magnetic field, a so-called synthetic pinned layer is usually used. The synthetic pinned layer includes an outer pinned layer, an inner pinned layer, and a non-magnetic intermediate layer which consists of Ru or Rh and which is sandwiched between the outer pinned layer and the inner pinned layer. Moreover, an antiferromagnetic layer is provided in contact with the outer pinned layer in order to fix the magnetization direction of the outer pinned layer. The antiferromagnetic layer typically consists of IrMn. In the synthetic pinned layer, the antiferromagnetic layer is coupled to the outer pinned layer via exchange coupling so that the magnetization direction of the outer pinned layer is fixed. The inner pinned layer is antiferromagnetically coupled to the outer pinned layer via the non-magnetic intermediate layer so that the magnetization direction of the inner pinned layer is fixed. Since the magnetization directions of the inner pinned layer and the outer pinned layer are anti-parallel to each other, magnetization of the pinned layer is limited as a whole. Despite such a merit of the synthetic pinned layer, however, a large number of layers are required to constitute the TMR element that includes the synthetic pinned layer. This imposes limitation on a reduction in the thickness of the MR stack.

Meanwhile, a novel layer configuration that is entirely different from that of the above-mentioned conventional MR stack has been proposed in recent years. In U.S. Pat. No. 7,035,062, a stack used for the CPP-type element, which includes two free layers and a non-magnetic intermediate layer that is sandwiched between the free layers, is disclosed. In this element, two free layers are exchange-coupled via a non-magnetic intermediate layer due to the RKKY (Rudermann, Kittel, Kasuya, Yoshida) interaction. A bias magnetic layer is provided on the side of the MR stack that is opposite to the air bearing surface, and a bias magnetic field is applied in a direction perpendicular to the air bearing surface. The magnetization directions of the two free layers adopt a certain relative angle because of the magnetic field applied from the bias magnetic layer. If an external magnetic field is applied from a recording medium in this state, then the magnetization directions of the two free layers are changed. As a result, the relative angle between the magnetization directions of the two free layers is changed, and accordingly, electric resistance of sense current is changed. By making use of such property, it becomes possible to detect an external magnetic field. Such a layer configuration using two free layers has the potential for facilitating a reduction in the gap between the shield layers, because it does not require a conventional synthetic pinned layer and an antiferromagnetic layer and allows a simplified layer configuration.

The layer configuration using two free layers has also a limitation that, in the initial state in which no bias magnetic field is applied, the two free layers must be coupled such that the magnetizations thereof are anti-parallel to each other. However, in the TMR element, since the non-magnetic intermediate layer is a non-conductive tunnel barrier layer, the RKKY interaction leading to antiferromagnetic exchange coupling cannot in principle occur between the two magnetic layers sandwiching the tunnel barrier layer. In addition, the tunnel barrier layer is thin having a thickness of 1 to 1.5 nm. The result is that the two magnetic layers sandwiching the tunnel barrier layer achieve ferromagnetic coupling which allows the magnetizations to be aligned parallel to each other. Therefore, it is extremely difficult to apply the layer configuration using two free layers to an element utilizing the TMR effect which can be expected as a magnetoresistance effect element having high sensitivity.

SUMMARY OF THE INVENTION

The present invention is directed to a magnetoresistance effect element utilizing a TMR effect having a layer configuration that includes a (MR) stack with a plurality of, at least three or more magnetic layers which forms a magnetoresistance effect film, and a bias magnetic layer located on an opposite side of the MR stack from an air bearing surface. An object of the present invention is to provide a magnetoresistance effect element having the above-mentioned layer configuration that is capable of improving recoding density by reducing the gap between the shields by simplification of the layer configuration, while realizing high sensitivity by utilizing the TMR effect.

According to an embodiment of the present invention, a magnetoresistance effect element comprises: a magnetoresistive stack including: first, second and third magnetic layers whose magnetization directions change in accordance with an external magnetic field, said second magnetic layer being located between said first magnetic layer and the third magnetic layer; a first non-magnetic intermediate layer sandwiched between said first and second magnetic layers, said first non-magnetic intermediate layer allowing said first magnetic layer and said second magnetic layer to be exchange-coupled such that the magnetization directions thereof are anti-parallel to each other when no magnetic field is applied; and a second non-magnetic intermediate layer sandwiched between said second and third magnetic layers, said second non-magnetic intermediate layer producing a magnetoresistance effect between said second magnetic layer and said third magnetic layer; wherein sense current is adapted to flow in a direction perpendicular to a film plane; a bias magnetic layer provided on an opposite side of said magnetoresistive stack from an air bearing surface, said bias magnetic layer applying a bias magnetic field to said magnetoresistive stack in a direction perpendicular to the air bearing surface.

Further, in the magnetoresistance effect element of the present invention, the first, second and third magnetic layers may be stacked in this order, or the third, second and first magnetic layers may be stacked in this order.

The inventor of the present application has found that when a bias magnetic field is applied to a magnetoresistance effect element having such a layer configuration, under a magnetic field of a certain magnitude, the magnetization directions of the first and third magnetic layers are fixed in the bias field direction, and that the magnetization direction of the second magnetic layer becomes anti-parallel with respect to that of the third magnetic layer. Subsequently, the second magnetic layer is magnetized by the magnetic field from a recording medium (the magnetization direction of the second magnetic layer is inclined), and thereby the reproduction signal (voltage) can be obtained. Application of a finite bias magnetic field can thus realize a state in which the magnetization directions of the second and third magnetic layers are anti-parallel to each other, and therefore, a larger magnetoresistance ratio based on the TMR effect between the second and third magnetic layers sandwiching the tunnel barrier layer can be obtained. Further, according to this structure, a reduction in thickness of the MR stack is also facilitated because it is not necessary to provide an antiferromagnetic layer and a synthetic pinned layer in the MR stack.

The above and other objects, features and advantages of the present invention will become apparent from the following description with reference to the accompanying drawings which illustrate examples of the present invention.

DETAILED DESCRIPTION OF THE PREFERRED EMBODIMENT

Figure 1:
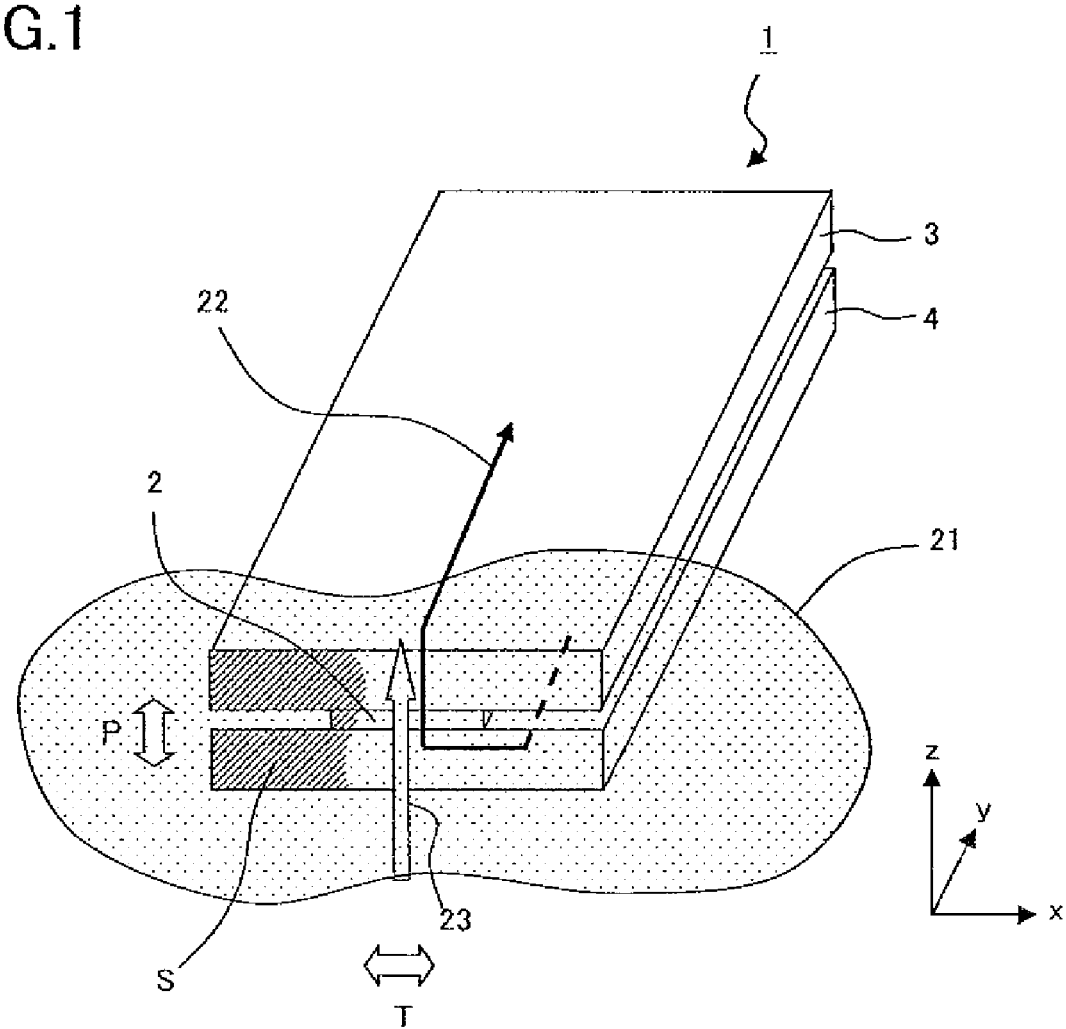
FIG. 1 is a conceptual perspective view of a magnetoresistance effect element according to an embodiment of the present invention.
Figure 2A:
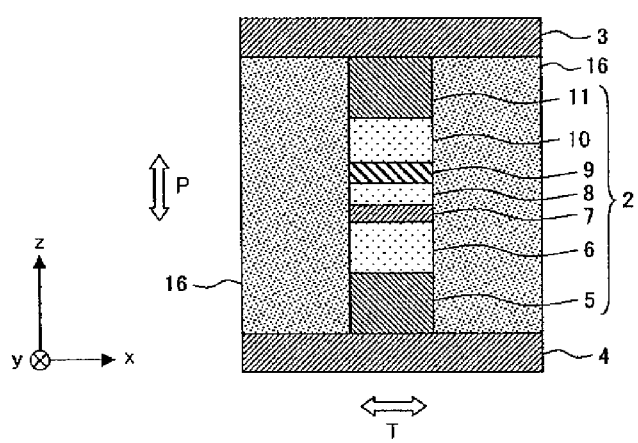
FIG. 2A is a sectional view of the magnetoresistance effect element when viewed from the surface parallel to the z-x plane of FIG. 1.
Figure 2B:
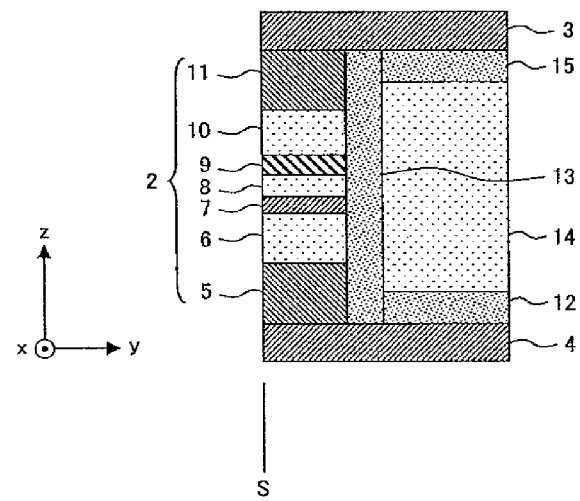
FIG. 2B is a sectional view of the magnetoresistance effect element in the surface parallel to the y-z plane of FIG. 1.

An embodiment of the present invention will now be described with reference to the attached drawings. A magnetoresistance effect element of the present embodiment is particularly suitable for use as a read head portion of a thin film magnetic head of a hard disc drive. FIG. 1 is a conceptual perspective view of a magnetoresistance effect element of the present embodiment. FIG. 2A is a side view of the magnetoresistance effect element 1 when viewed from the surface parallel to the z-x plane of FIG. 1, i.e., viewed from an air bearing surface (ABS) S. FIG. 2B is a sectional view of the magnetoresistance effect element 1 in the surface parallel to the y-z plane of FIG. 1, i.e., in the surface perpendicular to track width direction T. The air bearing surface refers to the surface of magnetoresistance effect element 1 that faces recording medium 21.

Magnetoresistance effect element 1 includes MR stack 2, upper shield electrode layer 3 and lower shield electrode layer 4 which are provided such that they sandwich MR stack 2 in the stacking direction of MR stack 2, bias magnetic layer 14 provided on the opposite surface of MR stack 2 from air bearing surface S, and insulating films 16, which are made of, e.g., $Al_2O_3$, $SiO_2$, SiON, and AlSiON, provided on both sides of MR stack 2 with regard to track width direction T.

MR stack 2 is sandwiched between upper shield electrode layer 3 and lower shield electrode layer 4 with the tip end thereof exposed at air bearing surface S. MR Stack 2 is adapted such that sense current 22 is caused to flow in direction P (z-direction in the drawings) that is perpendicular to the film plane when a voltage is applied between upper shield electrode layer 3 and lower shield electrode layer 4. The magnetic field of recording medium 21 at the position facing MR stack 2 changes in accordance with the movement of recording medium 21 in moving direction 23. The change in magnetic field is detected as a change in electric resistance which is caused by the magneto-resistance effect. Based on this principle, magnetoresistance effect element 1 reads magnetic information that is recorded in each magnetic domain of recording medium 21.

An example of a layer configuration of MR stack 2 is shown in Table 1. In the table, the layers are shown in the order of stacking, from buffer layer 5 in the bottom column, which is on the side of lower shield electrode layer 4, toward cap layer 9 in the top column, which is on the side of upper shield electrode layer 3. In Table 1, the numerical values in the row of "Composition" indicate atomic fractions of the elements, and 90Co10Fe indicates that the atomic composition ratio of Co to Fe is 90:10. MR stack 2 has a layer configuration including buffer layer 5, first magnetic layer 6, first non-magnetic intermediate layer 7, second magnetic layer (free layer) 8, second non-magnetic intermediate layer (tunnel barrier layer) 9, third magnetic layer 10, and cap layer 11, which are stacked in this order on lower shield electrode layer 4 that is made of an NiFe layer having a thickness of about 0.3 to 1.5 μm.

TABLE 1

| Layer Configuration | Composition | Thickness (nm) |
|---|---|---|
| Cap Layer 11 | Ta | 2.0 |
|  | Ru | 1.0 |
| Third Magnetic Layer 10 | 90Co10Fe | 2.2 |
| Second Non-magnetic Intermediate Layer (Tunnel Barrier Layer) 9 | MgO | 1.0 |
| Second Magnetic Layer (Free layer) 8 | 90Co10Fe | 1.1 |
| First Non-magnetic Intermediate Layer 7 | Ru | 0.8 |
| First Magnetic Layer 6 | 90Co10Fe | 2.5 |
| Buffer Layer 5 | Ru | 2.0 |
|  | Ta | 1.0 |

Buffer layer 5 is provided as a seed layer for first magnetic layer 6. First magnetic layer 6, second magnetic layer 8 and third magnetic layer 10 consist of a CoFe layer, and in the present embodiment, second magnetic layer 8 works mainly as a free layer, and its magnetization direction is changed in accordance with a magnetic field from the recording medium.

First non-magnetic intermediate layer 7 consisting of Ru that has a thickness of 0.8 nm is provided between first magnetic layer 6 and the second magnetic layer. First non-magnetic intermediate layer 7 allows first magnetic layer 6 and second magnetic layer 8 to be exchange-coupled such that the magnetization directions thereof are anti-parallel to each other when no magnetic field is applied. The material of first non-magnetic intermediate layer 7 is not limited to Ru as long as it can produce RKKY exchange coupling.

Second non-magnetic intermediate layer (tunnel barrier layer) 9 being non-magnetic and non-conductive is provided between second magnetic layer 8 and third magnetic layer 10. Tunnel barrier layer 9, which consists of MgO, produces the TMR effect between second magnetic layer (free layer) 8 and third magnetic layer 10. This allows a high magnetoresistance ratio to be realized. In addition, $AlO_x$, ZnO, AlN and $TiO_x$ can be also used as tunnel barrier layer 9. On the other hand, tunnel barrier layer 9 is thin having a thickness of about 1 nm to 1.5 nm. As a result, when no magnetic field is applied, tunnel barrier layer 9 allows second magnetic layer 8 and third magnetic layer 10 to be coupled such that the magnetization directions thereof are parallel to each other. Instead of tunnel barrier layer 9, a non-magnetic conductive layer (spacer layer) composed of an alloy including at least one of Cu, Ag, Au, Zn, Ru and Rh, which produces a GMR effect, may be used.

On cap layer 11, upper shield electrode layer 3, which is made of an 80Ni20Fe layer having a thickness of about 0.3 to 1.5 μm, is formed.

Upper shield electrode layer 3 and lower shield electrode layer 4 function as electrodes for supplying sense current to MR stack 2 in the direction of stacking P, and also function as shield layers for shielding a magnetic field emitted from adjacent bits on the same track of recording medium 21.

As shown in FIG. 2B, at the portion that is located on the opposite side of MR stack 2 from air bearing surface, bias magnetic layer 14 is formed via insulating layers 12, 13 and 15. Bias magnetic layer 14 is formed of material, such as CoPt, CoCrPt. Insulating layers 12, 13, 15 consist of $Al_2O_3$, or the like. Bias magnetic layer 14 exerts a bias magnetic field on MR stack 2 in a direction perpendicular to air bearing surface S so as to restrain the magnetization directions of first magnetic layer 6 and third magnetic layer 10. Insulating layers 12, 13, 15 are provided on the lower side, on the lateral side (between bias magnetic layer 14 and MR stack 2), and on the upper side of bias magnetic layer 14, respectively, thereby to prevent sense current 22 from flowing in bias magnetic layer 14.

Figure 3:
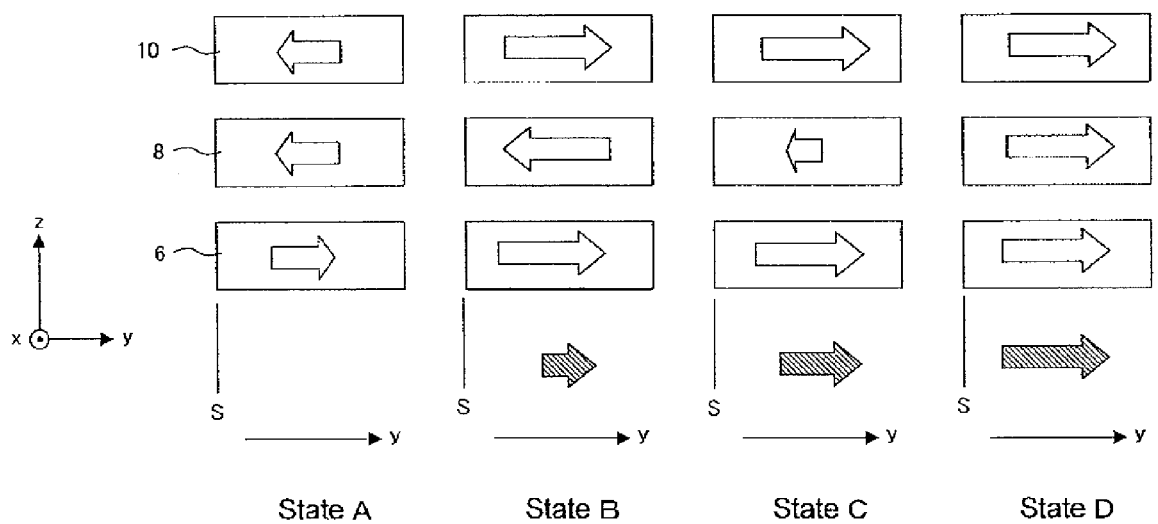
FIG. 3 is a conceptual view showing the magnetization direction of the first to third magnetic layers in typical states.

FIG. 3 is a conceptual view showing the magnetization directions of the first to third magnetic layers in typical states, and displays only the first to third magnetic layers in FIG. 2B. The size of the arrows in each of the magnetic layers indicates the magnitude of the magnetization, which rotates in the film plane, projected onto the direction perpendicular to air bearing surface S. Further, the shaded arrow indicates the magnitude of the bias magnetic field applied in the direction perpendicular to air bearing surface S. State A shows the state in which no magnetic field is applied, and states B to D show the states in which a bias magnetic field is applied. Each state B and D is the characteristic magnetization state respectively, and state C is the intermediate state therebetween.

In state A in which no magnetic field is applied, first magnetic layer 6 and second magnetic layer 8 are magnetized due to the RKKY interaction such that the magnetization directions thereof are anti-parallel to each other, as described above. On the other hand, second magnetic layer 8 and third magnetic layer 10 have the magnetization directions parallel to each other due to the ferromagnetic interaction via the tunnel barrier layer. Accordingly, in this state, the magnetization direction of first magnetic layer 6 and third magnetic layer 10 are anti-parallel and parallel, respectively, with respect to that of second magnetic layer 8, and thus three magnetic layers are stable.

And then, a bias magnetic field from bias magnetic layer 14 is applied in the direction perpendicular to air bearing surface S. In this case, the bias magnetic field is assumed to be applied in the direction from air bearing surface S to bias magnetic layer 14, i.e., in the +y direction in the drawings.

Here, the magnetic thickness of first magnetic layer 6 is required to be larger than that of second magnetic layer 8. By setting the magnetic thickness of first magnetic layer 6 to be large, the magnetization of first magnetic layer 6 is directed in the bias field direction (+y direction in the drawings). Therefore, the magnetization direction of second magnetic layer 8 can be anti-parallel to that of third magnetic layer directed to the bias magnetic field (+y direction in the drawings), while the magnetization of first magnetic layer 6 and second magnetic layer 8 are anti-parallel to each other. Meanwhile, unless the magnetic thickness of third magnetic layer 10 is set to be larger than that of the second magnetic layer, the magnetization of third magnetic layer 10 turns following the magnetization of the second magnetic layer directed in the −y direction due to ferromagnetic exchange coupling between second magnetic layer 8 and third magnetic layer 10, and is not directed in the bias field direction (+y direction in the drawings). In that case, the magnetization directions of third magnetic layer 10 and second magnetic layer 8 are no longer anti-parallel to each other. As a result, this is not preferable as a TMR element that is capable of realizing high sensitivity. For this reason, it is also desirable that the magnetic thickness of third magnetic layer 10 be larger than that of second magnetic layer.

Due to the above-described requirements, when the bias magnetic field is applied in the +y direction, both the magnetization of first magnetic layer 6 and third magnetic layer 10 gradually turn to the bias magnetic field, and then are completely fixed in the bias field direction, i.e. the +y direction, under a magnetic field having a certain magnitude, which is called exchange coupling magnetic field Hex. At this time, since second magnetic layer 8 is antiferromagnetically coupled to first magnetic layer 6 due to the RKKY interaction, second magnetic layer 8 is directed in the −y direction which is opposite to the bias field direction. In this manner, second magnetic layer 8 and third magnetic layer 10 can realize a state in which the magnetization directions thereof are anti-parallel to each other. This situation is shown in state A of FIG. 3.

Further, when the bias magnetic field is applied, the magnetization of second magnetic layer 8 starts to rotate (state C). When the bias magnetic field is further increased, the magnetization direction of second magnetic layer 8 is coincident with the bias field direction. Thus, the magnetization of three magnetic layers becomes parallel to one another, and is directed in the bias field direction (+y direction in the drawings), as shown in state D. The bias magnetic field in this state is called saturation magnetic field Hs.

In the state under a bias magnetic field between exchange coupling magnetic field Hex and saturation magnetic field Hs, when an external magnetic field from recording medium 21 is applied, the magnetization of second magnetic layer 8 rotates in a different direction depending on the direction and magnitude of the external magnetic field. More specifically, when the external magnetic field in the +y direction, which is the same as the bias magnetic field, is applied, the magnetization of second magnetic layer 8 turns in the direction so as to be parallel to that of other two magnetic layers 6 and 10, that is in the direction shown in state D. When the external magnetic field in the −y direction, which is opposite to the bias magnetic field, is applied, the magnetization of second magnetic layer 8 turns in the direction so as to be anti-parallel to that of other two magnetic layers 6 and 10, that is in the direction shown in state A. This change in the magnetization direction of second magnetic layer 8 due to the external magnetic field causes the resistance to the sense current flowing in the direction of stacking to be changed, and allows the magnitude of the external magnetic field to be detected.

When the magnetoresistance effect element is used for a practical thin film magnetic head, it is desirable to select a bias magnetic field having a magnitude which ideally lies at the midpoint between exchange coupling magnetic field Hex and saturation magnetic field Hs, or which actually maximizes the inclination of the curve of the magnetoresistance ratio with respect to the applied bias magnetic field.

As described above, in the present embodiment, application of a finite bias magnetic field allows a state in which the magnetization directions of the second and third magnetic layers are anti-parallel to each other to be realized. Accordingly, a large magnetoresistance ratio can be obtained based on the TMR effect between the second and third magnetic layers sandwiching the tunnel barrier layer, and a magnetoresistance effect element with higher sensitivity is feasible.

Further, in the present embodiment, the magnetization directions of the two magnetic layers sandwiching the tunnel barrier layer can be directed so as to be anti-parallel to each other without providing an antiferromagnetic layer and a synthetic pinned layer in the MR stack. Therefore, it is also advantageous that the present invention facilitates a reduction in thickness of the MR stack and contributes to further improvement of the track recording density.

In the present embodiment, the first, second and third magnetic layers are provided on the buffer layer in this order, but they may be provided in inverse order.

Example 1

Next, the result of studying the magnetic thickness ratio between the above-described magnetic layers will be described.

Several samples having the composition shown in Table 1 were prepared in which the thickness as a parameter in the shaded portions of the table was varied. The samples can be manufactured by a method described below. First, lower shield electrode layer 4 is prepared on a substrate. Next, each layer that constitutes MR stack 2 is formed on lower shield electrode layer 4 by means of sputtering. Next, the layers are formed into a shape by patterning, and portions on both sides with regard to track width direction T are filled with insulating films 16. Thereafter, by using milling, the MR stack is removed except for the portion whose height corresponds to the height of the element when measured from air bearing surface S, and then bias magnetic layer 14 is formed. As a result of the above-mentioned steps, insulating films 16 are formed on both sides of MR stack 2 with regard to track width direction T, and bias magnetic layer 14 is formed on the opposite side of MR stack 2 when viewed from air bearing surface S. Thereafter, upper shield electrode layer 3 is formed. In this way, magnetoresistance effect element 1 is manufactured.

Figure 4:
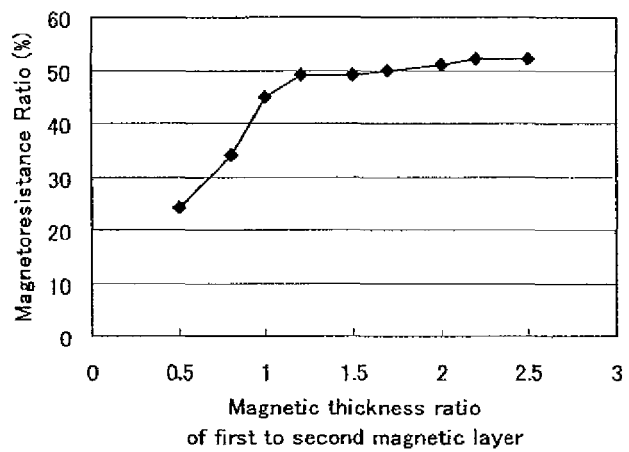
FIG. 4 is a diagram showing the magnetoresistance ratio with respect to the magnetic thickness ratio of the first to the second magnetic layer.

FIG. 4 is a diagram showing the magnetoresistance ratio of the magnetoresistance effect element with respect to the magnetic thickness ratio of first magnetic layer 6 to second magnetic layer 8 of the present invention.

As seen in the figure, the magnetoresistance ratio abruptly decreases as the magnetic thickness ratio of first magnetic layer 6 to second magnetic layer 8 decreases below 1.2. As the magnetic thickness of first magnetic layer 6 becomes smaller, second magnetic layer 8 becomes more sensitive to the bias magnetic field compared to the first magnetic layer. Namely, by following the bias magnetic field, the magnetization of second magnetic layer 8 destroys the anti-parallel state to that of third magnetic layer 10, and thus the observed magnetoresistance ratio decreases. Therefore, this also shows that the magnetic thickness of first magnetic layer 6 must be larger than that of second magnetic layer 8.

Figure 5:
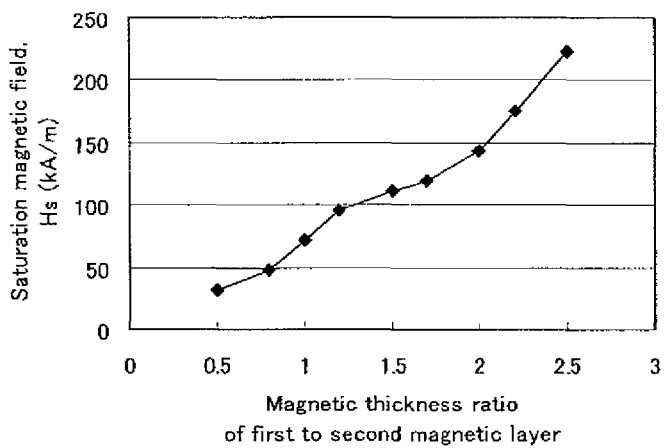
FIG. 5 is a diagram showing the magnitude of the saturation magnetic field with respect to the magnetic thickness ratio of the first to the second magnetic layer.

Meanwhile, as shown in FIG. 5, saturation magnetic field Hs becomes higher as the magnetic thickness of first magnetic layer 6 increases. Higher saturation magnetic field Hs means that the inclination of the curve of the magnetoresistance ratio with respect to the external magnetic field becomes gentle, and that the performance of the magnetoresistance effect element decreases. Further, since the applied bias magnetic field is finite, in the case that saturation magnetic field Hs is extremely high, the magnetoresistance effect element hardly operates as an actual reproducing element. As described above, the magnetic thickness of first magnetic layer 6 must be larger than that of second magnetic layer 8. However, for first magnetic layer 6 to operate as a magnetoresistance effect element, it is not preferable that the magnetic thickness of first magnetic layer 6 be too large.

These are the results in the state in which the magnetic thickness of third magnetic layer 10 is larger than that of the second magnetic layer, and in which the magnetic thickness is smaller than that of the first magnetic layer. In this range, the effect of the magnetic thickness of the third magnetic layer on the magnetoresistance ratio and on saturation magnetic field Hs can be ignored. In the present example, second magnetic layer 8 works mainly as a free layer, and its magnetization direction is changed in accordance with the external magnetic field from a recording medium.

Next, the dimensional relationship between the magnetic thicknesses of second magnetic layer 8 and third magnetic layer 10 will be verified. Here, as for the relationship between the magnetic thicknesses of first magnetic layer 6 and second magnetic layer 8, the magnetic thickness ratio of first magnetic layer 6 to second magnetic layer 8 is 2.0.

Figure 6:
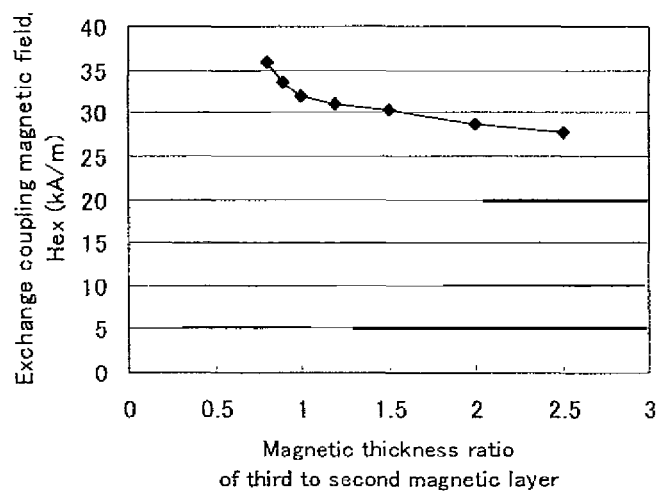
FIG. 6 is a diagram showing the magnitude of the exchange coupling magnetic field with respect to the magnetic thickness ratio of the second to the third magnetic layer.

FIG. 6 is a diagram showing the magnitude of exchange coupling magnetic field Hex with respect to the magnetic thickness ratio of third magnetic layer 10 to second magnetic layer 8. As seen in this figure, as the magnetic thickness of third magnetic layer 10 decreases with respect to that of second magnetic layer 8, the magnitude of exchange coupling magnetic field Hex, i.e. the magnetic field which realizes the anti-parallel state of the magnetization of second magnetic layer 8 and third magnetic layer 10, becomes larger. Specifically, this means that a larger magnitude of the bias magnetic field is required for fixing the magnetization direction of third magnetic layer 10 and for making the magnetization of second magnetic layer 8 and the third magnetic layer be antiparallel to each other. In that case, saturation magnetic field Hs also generally becomes large, again resulting in a decrease in performance of the magnetoresistance effect element. Therefore, from this point of view, it is also preferable that the magnetic thickness of third magnetic layer 10 be larger than that of second magnetic layer 8.

Example 2

In example 2, in order to study the configuration of each of the magnetic layers, a number of samples with each magnetic layer having a multilayer structure of CoFe and CoFeB was prepared in which the thickness ratio therebetween in each magnetic layer was varied. The method of manufacturing the sample is as described above. An example of a layer configuration in example 2 is shown in Table 2. In Table 2, the numerical values in the row of "Composition" indicate the atomic fractions of the elements, and 80(90Co10Fe)20B indicates that the atomic composition ratio of "90Co10Fe" to "B" contained in CoFeB is 80:20.

TABLE 2

| Layer Configuration | Composition | Thickness (nm) |
| --- | --- | --- |
| Cap Layer 11 | Ta | 2.0 |
|  | Ru | 1.0 |
| Third Magnetic Layer 10 | 80(90Co10Fe)20B | 2.9 |
|  | 90Co10Fe | 0.2 |

TABLE 2-continued

| Layer Configuration | Composition | Thickness (nm) |
| --- | --- | --- |
| Second Non-magnetic Intermediate Layer (Tunnel Barrier Layer) 9 | MgO | 1.0 |
| Second Magnetic Layer (Free layer) 8 | 90Co10Fe | 0.6 |
|  | 80(90Co10Fe)20B | 1.0 |
| First Non-magnetic Intermediate Layer 7 | Ru | 0.8 |
| First Magnetic Layer 6 | 90Co10Fe | 0.3 |
|  | 80(90Co10Fe)20B | 3.0 |
| Buffer Layer 5 | Ru | 2.0 |
|  | Ta | 2.0 |

Figure 7:
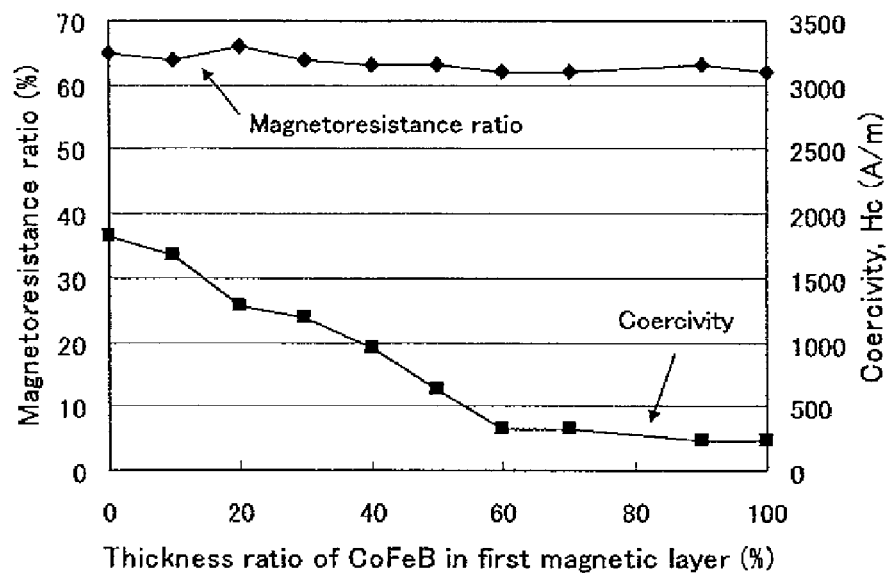
FIG. 7 is a diagram showing the magnetoresistance ratio and the magnitude of a coercivity with respect to the thickness ratio of a CoFeB layer in the first magnetic layer.

FIG. 7 is a diagram showing the magnetoresistance ratio and the magnitude of coercivity Hc, which represents the strength of the soft magnetic property, in first magnetic layer 6 of the magnetoresistance effect element having the layer configuration shown in Table 2 when the thickness ratio of CoFeB in first magnetic layer 6 is changed. Here, the thickness ratios of CoFeB in the other two magnetic layers 8 and 10 are 60% in second magnetic layer 8 and 90% in third magnetic layer 10, respectively.

As the thickness ratio of CoFeB increases, the magnetoresistance ratio remains almost unchanged, whereas the coercivity shows a rapid decrease and becomes constant above 60%. This indicates that coercivity Hc increases as the thickness ratio of CoFe, having a large magnetostriction constant, increases, while coercivity Hc can be reduced by increasing the thickness ratio of CoFeB that has a smaller magnetostriction constant than that of CoFe and that has excellent soft magnetic properties. In this figure, although only the result of first magnetic layer 6 is shown, the same tendency is also seen in third magnetic layer 10. Therefore, the increase in thickness of CoFeB in first magnetic layer 6 and third magnetic layer 10 does not contribute to an improvement of the magnetoresistance ratio, but is effective in reducing the coercivity. This causes the respective magnetic layers to respond uniformly to the external magnetic field, and thus the magnetic field can be detected with higher accuracy.

Figure 8:
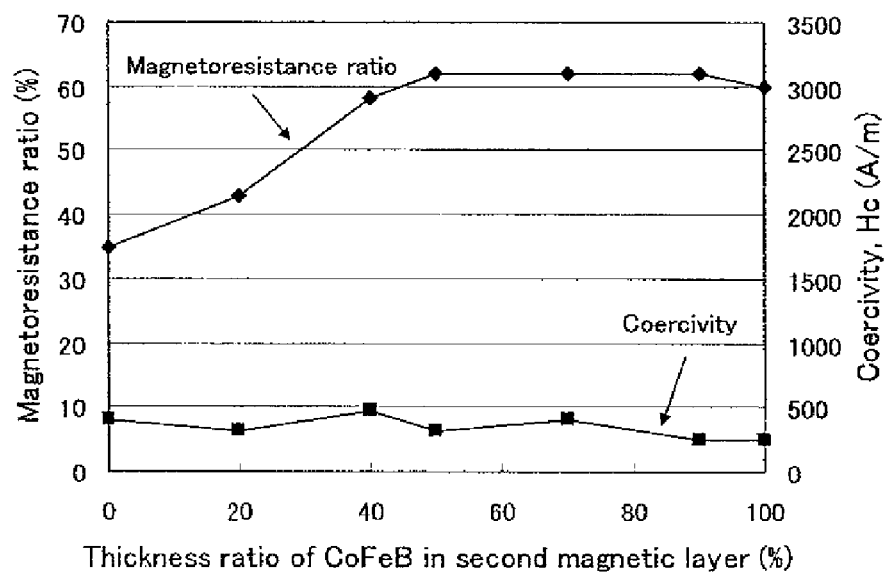
FIG. 8 is a diagram showing the magnetoresistance ratio and the magnitude of the coercivity with respect to the thickness ratio of a CoFeB layer in the second magnetic layer.

FIG. 8, as well as FIG. 7, is a diagram showing the magnetoresistance ratio and the magnitude of coercivity Hc in second magnetic layer 6 of the magnetoresistance effect element having the layer configuration shown in Table 2 when the thickness ratio of CoFeB in second magnetic layer 8 is changed. Here, the thickness rations of CoFeB in the other two magnetic layers 6 and 10 are 90% both in first magnetic layer 6 and third magnetic layer 10.

First of all, an improvement in the magnetoresistance ratio by increasing the thickness ratio of CoFeB is observed. Since CoFeB is microcrystalline, there is less concern that crystal grain will cause the flatness to deteriorate. On the other hand, since CoFe is crystalline and since its grain size becomes large as the film grows, the flatness deteriorates. Therefore, the increase in thickness of CoFeB leads to an improvement of flatness (planarization) of the film plane. This causes the strength of the ferromagnetic coupling between second magnetic layer 8 and third magnetic layer 10 to be decreased, and in second magnetic layer 8, the increase in thickness of CoFeB can contribute to an improvement of the magnetoresistance ratio.

Further, when the thickness ratio of CoFe having large saturation magnetization becomes large in second magnetic layer 8, the thickness of second magnetic layer 8 needs to be reduced because of the aforementioned relationship of the magnetic thickness ratio between first magnetic layer 6 and second magnetic layer 8. However, a reduced thickness of second magnetic layer 8 results in a decreased magnetoresistance ratio, and this is not preferable for realizing high sensitivity. Meanwhile, if the thickness of second magnetic layer 8 is not changed and if its magnetic thickness is maintained, then the thickness of first magnetic layer 6 must be increased. This leads to an increase in the total thickness of the TMR element, and it becomes difficult to reduce the gap between the shields. Thus, an addition of CoFeB having small saturation magnetization to second magnetic layer 8 also has the effect of being able to avoid these disadvantages.

As described above, in the embodiment of the present invention, it is more desirable for each of the magnetic layers to have a multilayer structure composed of CoFe and CoFeB than a single layer structure composed of CoFe.

Figure 9:
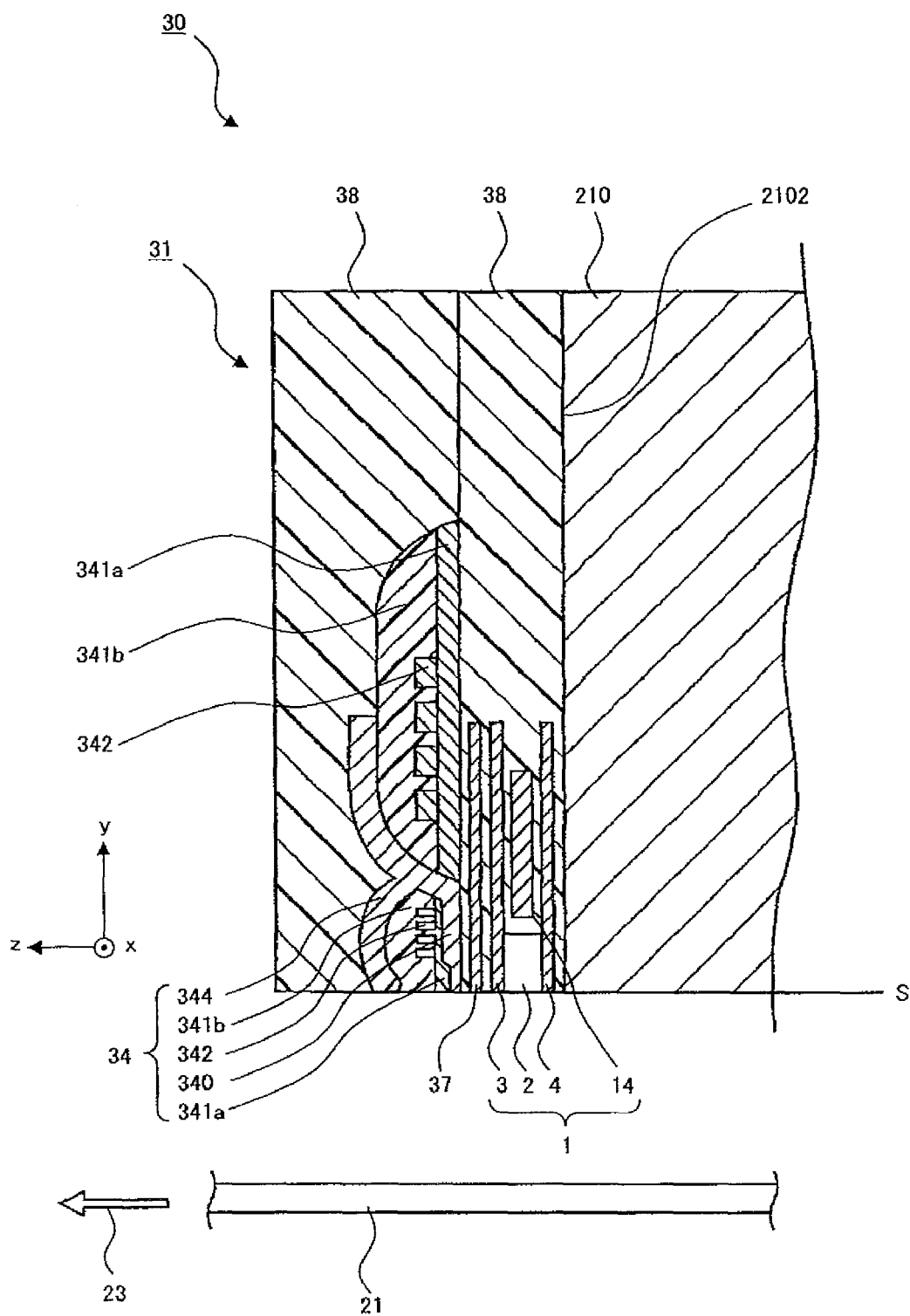
FIG. 9 is a cross-sectional diagram showing a thin film magnetic head in a plane that is perpendicular to an air bearing surface S.

The following describes a thin film magnetic head in which the magneto-resistance effect element in the present embodiment has been used. FIG. 9 is a cross-sectional diagram showing the thin film magnetic head in a plane (y-z plane in the drawings) perpendicular to air bearing surface S. As shown in FIG. 9, thin film magnetic head 30 includes slider 210 which is mainly composed of ALTIC ($AL_2O_3$—TiC), and magnetic head part 31. Magnetic head part 31 is provided on side surface 2102 of slider 210. Magnetic head part 31 includes magneto-resistance effect element 1 as a reproducing element and electromagnetic coil device 34 as an inductive-type electromagnetic conversion device.

The layers of MR stack 2 which forms magneto-resistance effect element 1 are provided to be substantially parallel to a side surface of slider 210, and lower shield electrode layer 4 is arranged to be closer to slider 210 than upper shield electrode layer 3. Upper and lower shield electrode layers 3 and 4 and MR stack 2 form a portion of air bearing surface S.

Device intermediate shield layer 37 composed of the same material as upper shield electrode layer 3 is formed between upper shield electrode layer 3 and electromagnetic coil device 34. Device intermediate shield layer 37 shields magneto-resistance effect element 1 from the magnetic field generated by electromagnetic coil device 34, and thereby reduces noise at readout. Further, a backing coil may be formed between device intermediate shield layer 37 and electromagnetic coil device 34. The backing coil generates magnetic flux which negates the magnetic flux loop via upper and lower shield electrode layers 3 and 4. As a result, it is possible to achieve suppression of the wide adjacent track erasure (WATE) phenomenon which entails unnecessary writing or deletion operations to recording medium 21.

Insulating layer 38 is formed between upper shield electrode layer 3 and device intermediate shield layer 37, between device intermediate shield layer 37 and electromagnetic coil device 34, and between lower shield electrode layer 4 and slider 210.

Electromagnetic coil device 34 is preferably a perpendicular magnetic recording-use coil. Electromagnetic coil device 34 includes main magnetic pole layer 340, gap layer 341a, coil insulating layer 341b, coil layer 342, and auxiliary magnetic pole layer 344. Main magnetic pole layer 340 leads magnetic flux induced by coil layer 342 to a recording layer of magnetic recording medium 21. Here, it is preferable that a width in the track-with direction (x-direction in the drawings) and a thickness in the layer direction (z-direction in the drawings) of the end portion of main magnetic pole layer 340 on the side of air bearing surface S are smaller than at other portions of main magnetic pole layer 340. Such an arrangement allows generation of a fine ferromagnetic field for supporting a high recording density.

The end portion of auxiliary magnetic pole layer 344 on air bearing surface S side which is magnetically coupled to main magnetic pole layer 340 forms a trailing shield part having a cross-sectional surface which is wider than other portions of auxiliary magnetic pole layer 344. Auxiliary magnetic pole layer 344 faces the end portion of main magnetic pole layer 340 on air bearing surface S side via gap layer 341a and coil insulating layer 341b. Gap layer 341a and coil insulating layer 341b are formed using an insulator such as alumina. By providing auxiliary magnetic pole layer 344, the magnetic field gradient between auxiliary magnetic pole layer 344 and main magnetic pole layer 340 in the region of air bearing surface S is increased. As a result, jitter in the signal output is reduced, and the error rate during reading is reduced.

The thickness of auxiliary magnetic pole layer 344 is approximately 0.5 to 5 μm, and is constructed from an alloy composed of two or three materials selected from Ni, Fe, and Co, an alloy mainly composed of these materials with other elements added, or the like. Auxiliary magnetic pole layer 344 is formed using, for instance, a frame plating method or a sputtering method.

Gap layer 341a is formed between coil layer 342 and main magnetic pole layer 340, and is composed of $Al_2O_3$, DLC (Diamond-Like Carbon) or the like, at a thickness of 0.01 to approximately 0.5 μm. To form gap layer 341a, a sputtering method, a CVD method, or the like may be used.

Coil layer 342 is, for instance, formed from Cu or the like at a thickness of approximately 0.5 to approximately 3 μm. To form coil layer 342, a frame plating method or the like may be used. A rear end of main magnetic pole layer 340 is joined to a portion, of auxiliary magnetic pole layer 344, that is positioned away from air bearing surface S. Coil layer 342 is formed so as to surround this joint portion.

A coil insulating layer 341b composed of an insulator, such as a aluminum oxide or a cured resist layer, at a thickness of 0.1 to approximately 5 μm is formed between coil layer 342 and auxiliary magnetic pole layer 344. Insulating layer 38 is formed so as to cover electromagnetic coil device 34 on an opposite side of electromagnetic coil device 34 to the side of slider 210.

Figure 10:
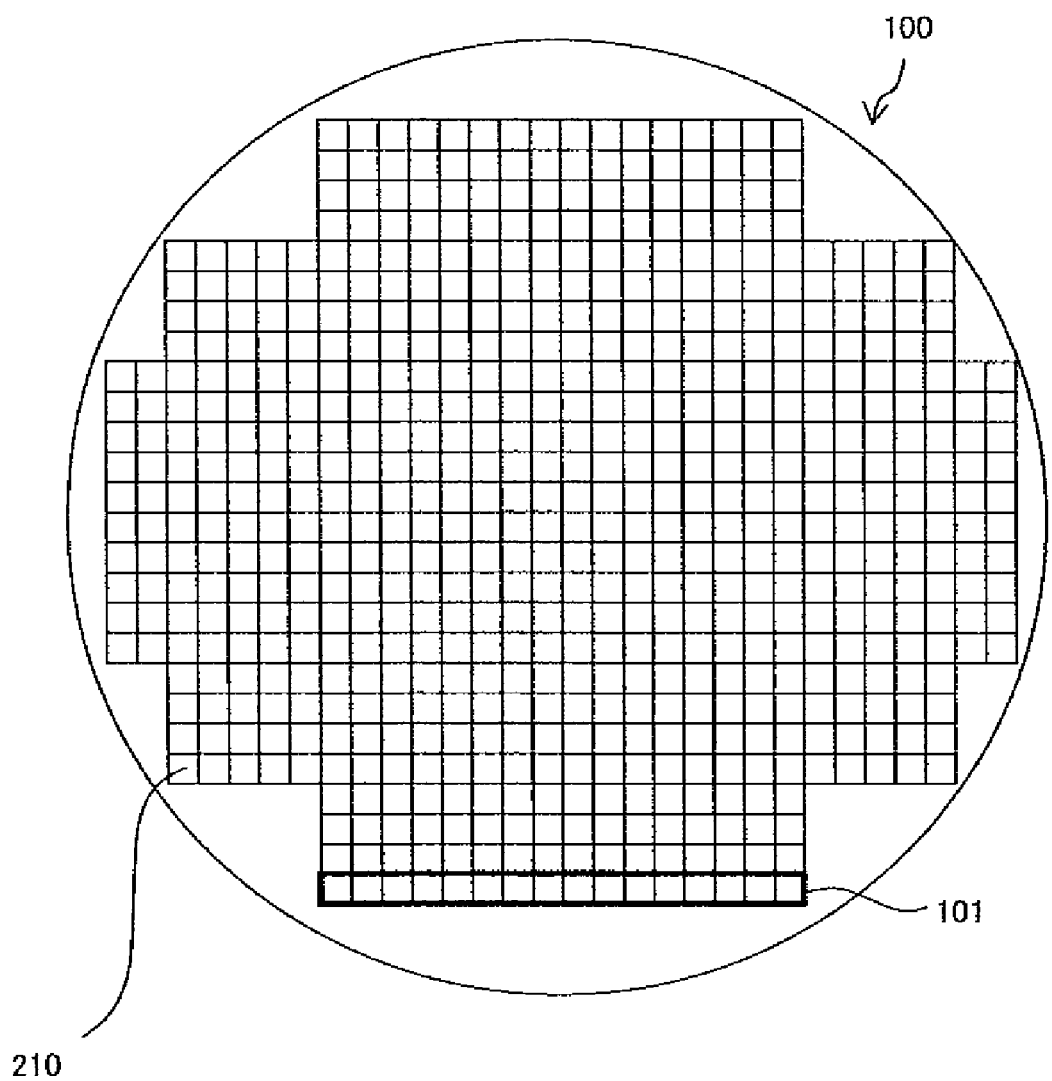
FIG. 10 is a plan view of a wafer which is used to manufacture the magnetoresistance effect element of the present invention.

Next, explanation will be made regarding a wafer for fabricating the magnetoresistance effect element which can be manufactured by the method described above. FIG. 10 is a schematic plan view of a wafer. Wafer 100 has a MR stack which is deposited thereon to form at least magneto-resistance effect element. Wafer 100 is diced into bars 101 which serve as working units in the process of forming the air bearing surface. After lapping, bar 101 is diced into sliders 210 which include thin film magnetic heads. Dicing portions, not shown, are provided in wafer 100 in order to dice wafer 100 into bars 101 and into sliders 210.

Figure 11:
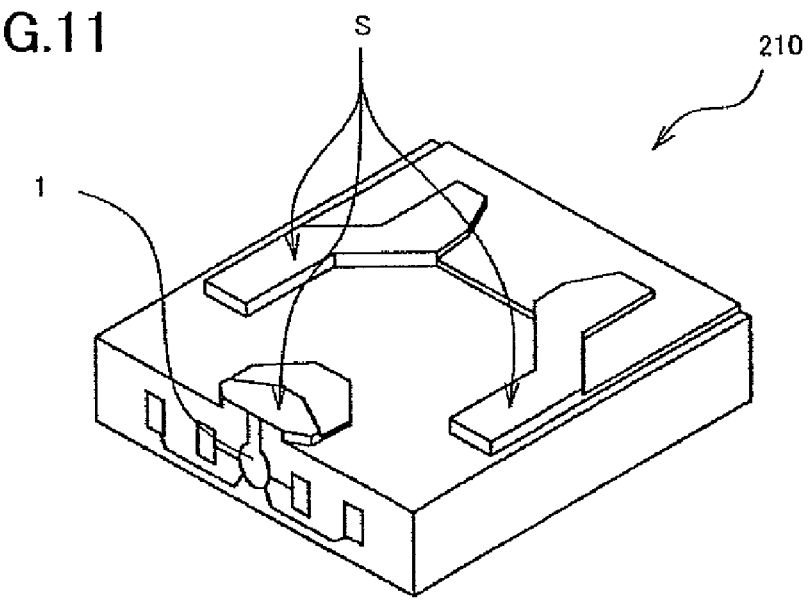
FIG. 11 is a perspective view of a slider of the present invention.
Figure 11:
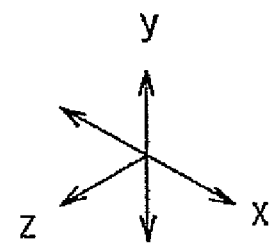

Referring to FIG. 11, slider 210 has a substantially hexahedral shape. One of the six surfaces of slider 210 forms the air bearing surface, which is positioned opposite to the hard disk.

Figure 12:
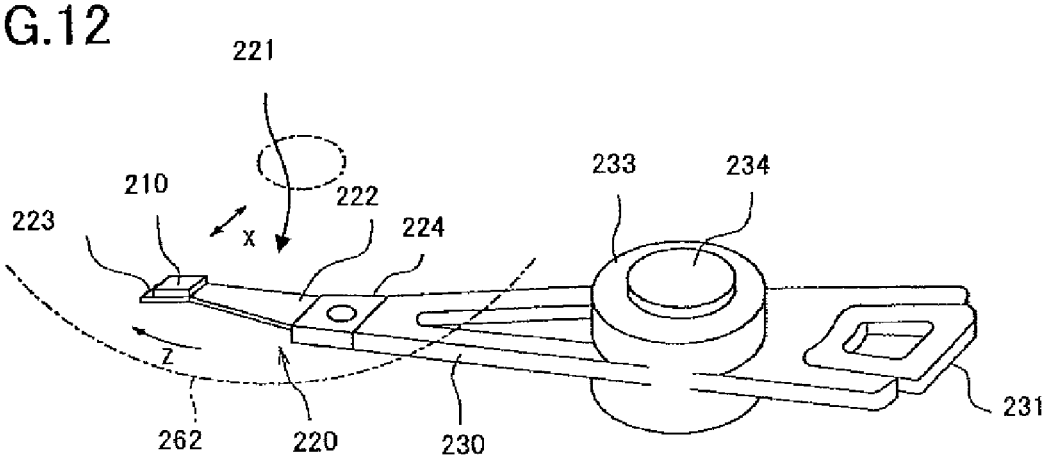
FIG. 12 is a perspective view of a head arm assembly which includes a head gimbal assembly which incorporates the slider of the present invention.

Referring to FIG. 12, head gimbal assembly 220 has slider 210 and suspension 221 for resiliently supporting slider 210. Suspension 221 has load beam 222 in the shape of a flat spring and made of, for example, stainless steel, flexure 223 that is attached to one end of load beam 222, and base plate 224 provided on the other end of load beam 222. Slider 210 is fixed to flexure 223 to provide slider 210 with an appropriate degree of freedom. The portion of flexure 223 to which slider 210 is attached has a gimbal section for maintaining slider 210 in a fixed orientation.

Slider 210 is arranged opposite to hard disk 262, which is a rotationally-driven disc-shaped storage medium, in a hard disk drive. When hard disk rotates in the z-direction shown in FIG. 12, airflow which passes between hard disk and slider 210 creates a dynamic lift, which is applied to slider 210 downward in the y-direction. Slider 210 is configured to lift up from the surface of hard disk due to this dynamic lift effect. Magneto-resistance effect element 1 is formed in proximity to the trailing edge (the end portion at the lower left in FIG. 11) of slider 210, which is on the outlet side of the airflow.

The arrangement in which head gimbal assembly 220 is attached to arm 230 is called head arm assembly 221. Arm 230 moves slider 210 in transverse direction x with regard to the track of hard disk 262. One end of arm 230 is attached to base plate 224. Coil 231, which constitutes a part of a voice coil motor, is attached to the other end of arm 230. Bearing section 233 is provided in the intermediate portion of arm 230. Arm 230 is rotatably held by shaft 234 which is attached to bearing section 233. Arm 230 and the voice coil motor to drive arm 230 constitute an actuator.

Figure 13:
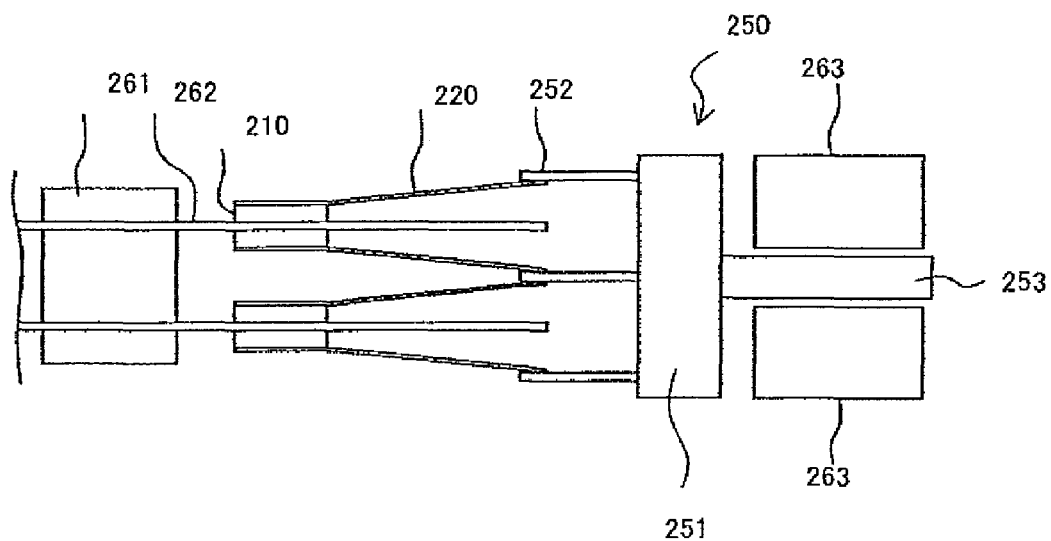
FIG. 13 is a side view of a head arm assembly which incorporates sliders of the present invention.
Figure 14:
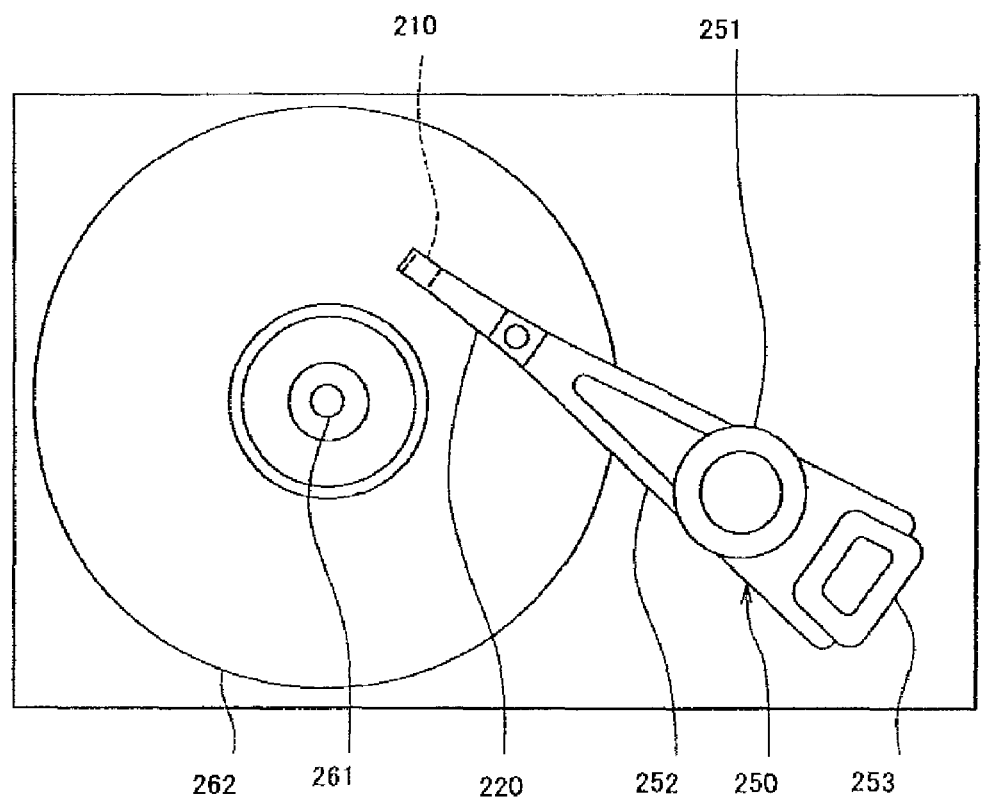
FIG. 14 is a plan view of a hard disk drive which incorporates sliders of the present invention.

Referring to FIG. 13 and FIG. 14, a head stack assembly and a hard disk drive that incorporate the slider mentioned above will be explained next. The arrangement in which head gimbal assemblies 220 are attached to the respective arm of a carriage having a plurality of arms is called a head stack assembly. FIG. 13 is a side view of a head stack assembly, and FIG. 14 is a plan view of a hard disk drive. Head stack assembly 250 has carriage 251 provided with a plurality of arms 252. Head gimbal assemblies 220 are attached to arms 252 such that head gimbal assemblies 220 are arranged apart from each other in the vertical direction. Coil 253, which constitutes a part of the voice coil motor, is attached to carriage 251 on the side opposite to arms 252. The voice coil motor has permanent magnets 263 which are arranged in positions that are opposite to each other and interpose coil 253 therebetween.

Referring to FIG. 14, head stack assembly 250 is installed in a hard disk drive. The hard disk drive has a plurality of hard disks 262 which are connected to spindle motor 261. Two sliders 210 are provided per each hard disk 262 at positions which are opposite to each other and interpose hard disk 262 therebetween. Head stack assembly 250 and the actuator, except for sliders 210, work as a positioning device in the present invention. They carry sliders 210 and work to position sliders 210 relative to hard disks 262. Sliders 210 are moved by the actuator in the transverse direction with regard to the tracks of hard disks 262, and positioned relative to hard disks 262. Magneto-resistance effect element 1 that is included in slider 210 writes information to hard disk 262 by means of the write head portion, and reads information recorded in hard disk 262 by means of the read head portion.

Although certain preferred embodiments of the present invention have been shown and described in detail, it should be understood that various changes and modifications may be made without departing from the spirit or scope of the appended claims.

What is claimed is:

1. A magnetoresistance effect element comprising:
 a magnetoresistive stack including:
  first, second and third magnetic layers whose magnetization directions change in accordance with an external magnetic field, said second magnetic layer being located between said first magnetic layer and the third magnetic layer;
  a first non-magnetic intermediate layer sandwiched between said first and second magnetic layers, said first non-magnetic intermediate layer allowing said first magnetic layer and said second magnetic layer to be exchange-coupled such that the magnetization directions thereof are anti-parallel to each other when no magnetic field is applied; and
  a second non-magnetic intermediate layer sandwiched between said second and third magnetic layers, said second non-magnetic intermediate layer producing a magnetoresistance effect between said second magnetic layer and said third magnetic layer;
  wherein sense current is adapted to flow in a direction perpendicular to a film plane;
 a bias magnetic layer provided on an opposite side of said magnetoresistive stack from an air bearing surface, said bias magnetic layer applying a bias magnetic field to said magnetoresistive stack in a direction perpendicular to the air bearing surface.

2. The magnetoresistance effect element according to claim 1,
 wherein said first, second and third magnetic layers are stacked in this order.

3. The magnetoresistance effect element according to claim 1,
 wherein said third, second and first magnetic layers are stacked in this order.

4. The magnetoresistance effect element according to claim 1,
 wherein said second non-magnetic intermediate layer is composed of MgO.

5. The magnetoresistance effect element according to claim 1,
 wherein said second non-magnetic intermediate layer is composed of at least any one of $AlO_x$, ZnO, AlN and $TiO_x$.

6. The magnetoresistance effect element according to claim 1,
 wherein said second non-magnetic intermediate layer is a tunnel barrier layer which produces a tunnel magnetoresistance effect between said second magnetic layer and said third magnetic layer.

7. The magnetoresistance effect element according to claim 1,
 wherein said first non-magnetic intermediate layer is composed of an alloy including one or more elements among Cu, Ag, Au, Zn, Ru and Rh.

8. The magnetoresistance effect element according to claim 1,
 wherein said first magnetic layer has a larger magnetic thickness than said second magnetic layer.

9. The magnetoresistance effect element according to claim 8,
 wherein a magnetic thickness ratio of said first magnetic layer to said second magnetic layer is 1.2 or more.

10. The magnetoresistance effect element according to claim 1,
 wherein said third magnetic layer has a larger magnetic thickness than said second magnetic layer.

11. The magnetoresistance effect element according to claim 1,
 wherein said first, second and third magnetic layers have a stack structure composed of CoFe and CoFeB.

12. A slider including the magnetoresistance effect element according to claim 1.

13. A head gimbal assembly including the slider according to claim 12, and a suspension for elastically supporting the slider.

14. A hard disc drive including the slider according to claim 12, and a device for supporting the slider and for positioning the slider with respect to a recording medium.

15. A wafer having the magnetoresistive stack that is to be formed into the magnetoresistance effect element according to claim 1.

* * * * *